United States Patent [19]

Resch

[11] Patent Number: 4,564,858

[45] Date of Patent: Jan. 14, 1986

[54] TELEVISION SAW/VSB FILTER INCORPORATING RECEIVER EQUALIZER

[75] Inventor: William A. Resch, Quincy, Ill.

[73] Assignee: Harris Corporation, Melbourne, Fla.

[21] Appl. No.: 640,209

[22] Filed: Aug. 10, 1984

Related U.S. Application Data

[63] Continuation of Ser. No. 363,819, Mar. 31, 1981, abandoned.

[51] Int. Cl.⁴ .................. H04N 5/40; H03H 9/44; H03H 9/64
[52] U.S. Cl. ................................. 358/21 R; 358/186; 333/194; 333/195
[58] Field of Search ............ 358/197, 198, 186, 191.1, 358/21 R, 11, 35; 333/150, 153, 193, 194, 195, 28 R; 332/37 R, 45; 455/114, 307

[56] References Cited

U.S. PATENT DOCUMENTS

| | | | |
|---|---|---|---|
| 3,872,410 | 3/1975 | Zucker | 358/DIG. 1 |
| 4,030,050 | 6/1977 | Deacon | 358/DIG. 1 |
| 4,096,454 | 6/1978 | Behrend | 333/193 |
| 4,212,029 | 7/1980 | Murakami | 358/DIG. 1 |
| 4,237,432 | 12/1980 | Huang | 333/193 |
| 4,342,011 | 7/1982 | Iwamoto | 333/193 |
| 4,417,221 | 11/1983 | Hunsinger | 333/194 |

FOREIGN PATENT DOCUMENTS 1381912  1/1975  United Kingdom ......... 358/DIG. 1

OTHER PUBLICATIONS

A Delay Lineless Video Signal Processing Circuit Using a New Surface Acoustic Wave Filter for Television Receivers, by I. Nishimura et al., IEEE Transactions on Consumer Electronics, vol. CE-26, Aug. 1980, pp. 376-387.

*Primary Examiner*—Tommy P. Chin
*Attorney, Agent, or Firm*—Yount & Tarolli

[57] ABSTRACT

A visual exciter for use in a television broadcasting system is disclosed. The exciter includes a surface acoustic wave (SAW) filter for vestigial sideband filtering of an RF carrier signal amplitude modulated with a video signal. The SAW filter has a time delay versus frequency characteristic which is designed to compensate for a complementary delay characteristic of a TV receiver. The need for a separate receiver equalization circuit is therefore eliminated.

4 Claims, 8 Drawing Figures

TELEVISION SAW/VSB FILTER INCORPORATING RECEIVER EQUALIZER

This application is a continuation of application Ser. No. 363,819 filed Nov. 31, 1981 now abandoned.

BACKGROUND AND FIELD OF THE INVENTION

The present invention relates to receiver equalizers used in television broadcasting to provide signal delays compensating for complementary delays in television receivers.

Government established broadcasting standards for color television service set forth a uniform format for the color television signal which are transmitted by licensed television stations. In this format the color television signal is amplitude modulated onto the station carrier, with the resulting double sideband signal being filtered by a vestigial sideband filter so as to eliminate a large portion of the lower sideband thereof. The upper sideband, however, remains intact and extends out to more than 4.2 MHz above the carrier frequency. The sound, or aural signal is transmitted on a subcarrier located 4.5 MHz above the picture carrier.

In order to eliminate interference between the sound carrier and the higher frequency video information, receivers must include filters with high roll-off rates in the vicinity of 4.5 MHz. When the composite video signal is passed through these filters, the upper frequencies of the color signal experience a time delay which must be corrected. This was recognized at the time that the format was adopted by the Federal Communications Commission (FCC) of the United States government, and, to simplified the manufacture of television receivers, it was decided that the correction would be provided at the transmitter, rather than at the receiver. The FCC therefore now mandates that each transmitter include a time delay versus frequency characteristic selected to be the complement of the time delay versus frequency characteristic produced by the sound filter in subsequent receivers.

In TV transmitters currently in use, the receiver equalizer is implemented as a separate functional block including plural discrete components which are designed and adjusted such that the amplitude versus frequency characteristic of the filter is substantially flat over the frequency range of the video signal, but that its time delay versus frequency characteristic is such as to provide the receiver equalization set by FCC standards.

The receiver equalizer adds somewhat to the size of the visual exciter with which it is employed, and includes plural adjustable components which must be calibrated by the manufacturer during the manufacturing process, and which are thereafter susceptible to aging and failure. The receiver equalizer also, obviously, adds to the cost of the visual exciter. For these reasons, then, it would be desirable if the receiver equalizer could be done away with. Receiver equalization is, however, required by law in all transmitters.

SUMMARY OF THE INVENTION

It is an object of the present invention to provide method and apparatus for providing receiver equalization in a visual exciter without use of a receiver equalizer, per se.

It is another object of the present invention to provide a visual exciter wherein the receiver equalization function is performed by another device already incorporated into the transmitter.

It is yet another object of the present invention to provide a receiver equalizer which does not require adjustment at the factory, and which does not include plural individual separate parts.

In accordance with the present invention, a visual exciter is provided including a surface acoustic wave (SAW) filter for vestigial sideband (VSB) filtering of a video signal, wherein the SAW filter has a relative time delay versus frequency characteristic which is selected to compensate for complimentary delay characteristic of a subsequent TV receiver, whereby the need for a separate receiver equalizer is obviated.

In accordance with another aspect of the present invention, a SAW filter is provided having the amplitude versus frequency characteristic of a vestigial sideband filter of a visual exciter, and the relative time delay versus frequency characteristic of a receiver equalizer of the visual exciter.

BRIEF DESCRIPTION OF THE DRAWINGS

The foregoing and other objects and advantages of the present invention will become more readily apparent from the following detailed description, as taken in conjunction with the accompanying drawings, wherein.

DETAILED DESCRIPTION

Figure 1:
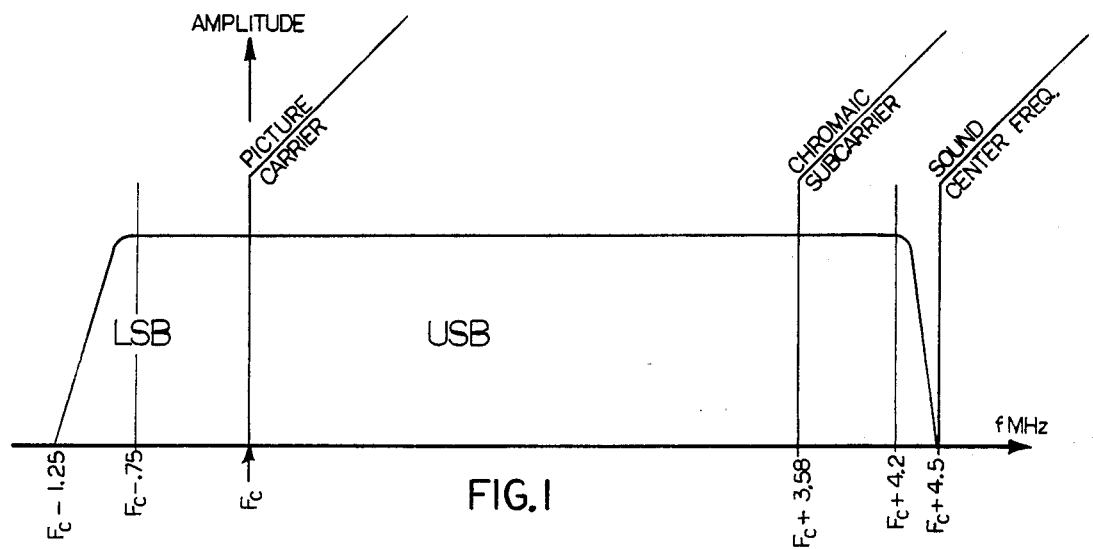
FIG. 1 is a graph of the amplitude versus frequency characteristics of a broadcast television signal.

FIG. 1 is a graph generally illustrating the frequency distribution of a color TV signal. The color TV signal includes a picture carrier component at frequency $F_c$. This is the station frequency upon which the video signal is amplitude modulated. Since the composite modulated signal includes frequencies as great as 4.5 MHz, the amplitude modulated picture carrier would normally include a lower sideband extending down to 4.5 MHz below the picture carrier and an upper sideband extending up to 4.5 MHz above the picture carrier. To conserve the frequency spectrum, however, the FCC has mandated that the bandwith of the lower sideband be restricted so that the entire video signal has a frequency bandwidth of approximately 6 MHz.

The sound signal which accompanies the video signal is frequency modulated onto a carrier frequency 4.5 MHz above the station frequency, placing in quite close frequency proximity to the higher frequencies in the upper sideband of the video signal. In a receiver, this sound signal must be severely attenuated to prevent interference with the subsequently displayed picture. The filters used in eliminating the sound carrier frequency from the video signal provide substantial time delays for higher frequencies of the video signal. These time delays must be compensated for elsewhere in the system. The compensation is accomplished at the transmitter in order to simplify the circuitry at the receiver. Each transmitter is thus required to include a receiver equalizer having a time delay versus frequency characteristic designed to compensate for the time delay versus frequency characteristic of the sound filter in television receivers.

Figure 2:
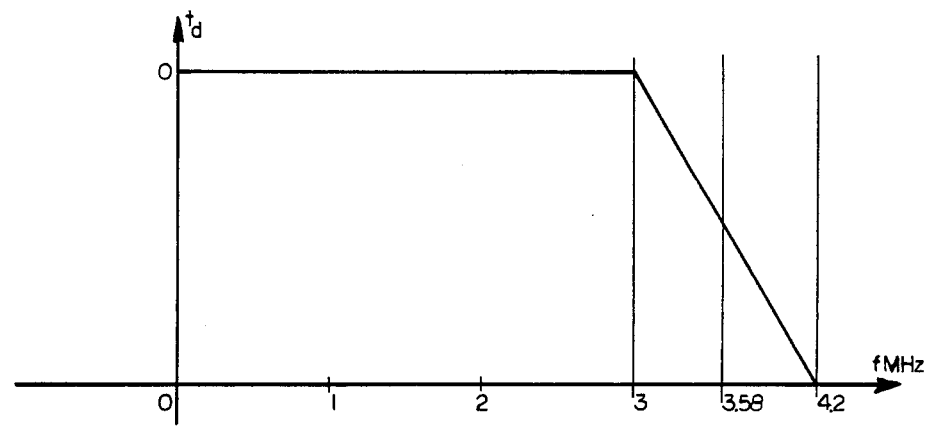
FIG. 2 is a graph of the relative time delay versus frequency characteristics of a broadcast television signal.
Figure 3:
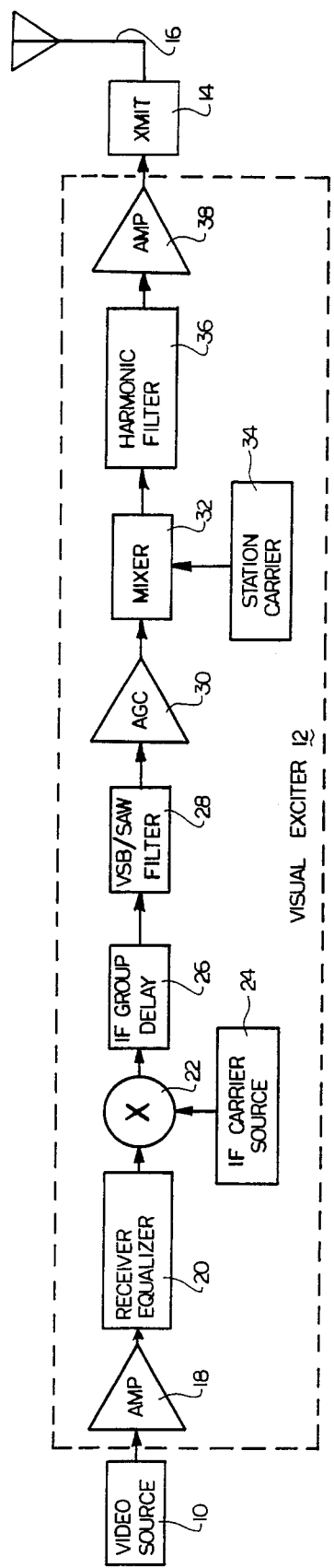
FIG. 3 is a block diagram of a prior art visual exciter.

The required time delay versus frequency characteristic is illustrated in graph form in FIG. 2. In this figure it can be seen that the time delay to be provided by the receiver equalizer is substantially flat from 0 MHz up to 3 MHz, and thereafter changes at linear rate, becoming −170 nanoseconds at approximately 3.6 MHz and −345 nanoseconds at approximatelyl 4.2 MHz. In other words, frequencies above 3 MHz are advanced in time relative to lower frequencies. Conventional TV transmitters implement this receiver equalization function by providing a separate all-pass filter (i.e., a filter with a flat amplitude versus frequency characteristic) which includes the time delay versus frequency characteristic shown in FIG. 2. FIG. 3 is a block diagram of a prior art visual transmitter of this type.

In FIG. 3, a video signal source 10 is illustrated as providing a composite video signal (not including the aural portion of the signal) to a visual exciter 12. The visual exciter 12 utilizes the video signal to modulate the station carrier, providing a signal having generally the frequency distribution shown in FIG. 1 but lacking the aural carrier centered at 4.5 MHz above the station carrier. The visual exciter provides the modulated RF signal to the transmitter 14, which is conventionally a high powered linear RF amplifier. A transmitter amplifies the low level RF visual signal provided by the visual exciter, and provides it to an antenna network 16 for transmission. The modulated aural carrier is produced by other circuitry not shown in FIG. 3, and is then added into the signal provided by transmitter 14 in a diplexer (also not shown) connected between the transmitter 14 and the antenna network 16.

In FIG. 3, the visual exciter is shown as including a video amplifier 18 which amplifies the video signal provided by the video source 10. The resulting amplified video signal is fed to a receiver equalizer 20. As stated above, the receiver equalizer 20 is an all-pass filter having a time delay versus frequency characteristic designed to compensate for time delay versus frequency distortion in the subsequent receiver filter. The equalized video signal is then provided to an amplitude modulator 22, which amplitude modulates an IF carrier signal provided by the IF carrier source 24 in accordance therewith. The majority of the RF signal processing in the visual exciter is done at a standardized IF frequency of 37 MHz so as to standardize the design of the components thereof. The same processing could be done at the station frequency, however in this case different components would be required for each different station frequency.

The output of the amplitude modulator 22 is an amplitude modulated signal including an IF carrier component and two symmetrical sidebands. The amplitude modulated signal is directed to an IF amplifier and group delay circuit 26, which amplifies it and provides phase and amplitude adjustment thereof so as to compensate for nonlinear effects of other circuitry in the exciter.

The vestigial sideband filter 28 eliminates a portion of the upper sideband of the modulated IF signal appearing at the output of the IF group delay circuit 26. The VSB filter 28 is conventionally a surface acoustic wave (SAW) device, since these devices are small and are characterized by flat pass bands and sharp roll offs at the corner frequencies. The vestigial sideband signal resulting from the filtering process is provided to an automatic gain control amplifier 30 and then to a mixer 32 which mixes the vestigial sideband signal with the output of a carrier oscillator 34. The oscillator 34 provides a carrier having a frequency equal to the station frequency plus 37 MHz. The result of the mixing process is a composite signal including four frequency components: an IF component, a carrier oscillator component, a sum component corresponding to the sum of the frequencies of the IF signal and the carrier, and a difference signal corresponding to the difference between the frequencies of the IF signal and the carrier. The output of the mixer 32 is directed to a harmonic filter 36 which eliminates three of these four components. The only component remaining at the output of the harmonic filter 36 is that component representing the difference between the frequencies of the IF signal and the carrier oscillator signal.

The net effect of the mixer 32 and the harmonic filter 36 is to convert the IF signal from the IF frequency of 37 MHz up to the station frequency and to "flip" it about the carrier frequency such that the positions of the upper and lower sidebands are reversed. Consequently, although the IF signal is a vestigial sideband signal having its upper sideband substantially reduced, the output of the harmonic filter 36 is a vestigial sideband signal having its lower sideband substantially reduced. This VSB signal is then directed to an RF amplifier 38, which buffers the output of the visual exciter 12.

Figure 4:
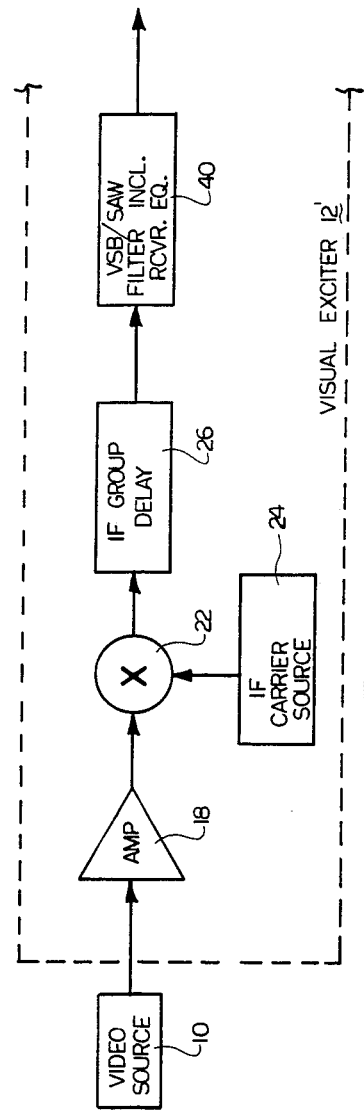
FIG. 4 is a block diagram of a visual exciter in accordance with the teachings of the present invention.

In accordance with the present invention, a visual exciter is provided which eliminates the use of a separate receiver equalizer circuit, such as receiver equalizer 20 in FIG. 3. FIG. 4 is a block diagram of the modified portion of the visual exciter 12 of FIG. 3. For convenience of description, the elements of FIG. 4 corresponding with similar elements of FIG. 3 are denoted by corresponding reference numerals.

In the FIG. 4 circuitry, as in the FIG. 3 circuitry, the output of the video source 10 is directed to a video amplifier 18. In visual exciter 12' of FIG. 4, however, the receiver equalizer 20 is eliminated, whereby the output of the amplifier 18 is applied directly to the input of the amplitude modulator 22. The output of the amplitude modulator 22 is again directed to the IF amplifier/group delay circuit 26, whose output signal in this case is fed to a VSB/SAW filter having a different form than used in the prior art.

The VSB/SAW filter 40 of FIG. 4 is designed to have an amplitude versus frequency characteristic similar to that of past VSB/SAW filters, whereby it provides the desired VSB filtering of the IF signal. However, whereas past VSB/SAW filters have had flat time delay versus frequency characteristics, the VSB/SAW filter 40 of FIG. 4 is designed to have a time delay versus frequency characteristic of a receiver equalizer. The output of the VSB/SAW filter 40 is directed to an AGC amplifier 30, and thereafter to the remaining circuitry shown in FIG. 3.

Figure 5:
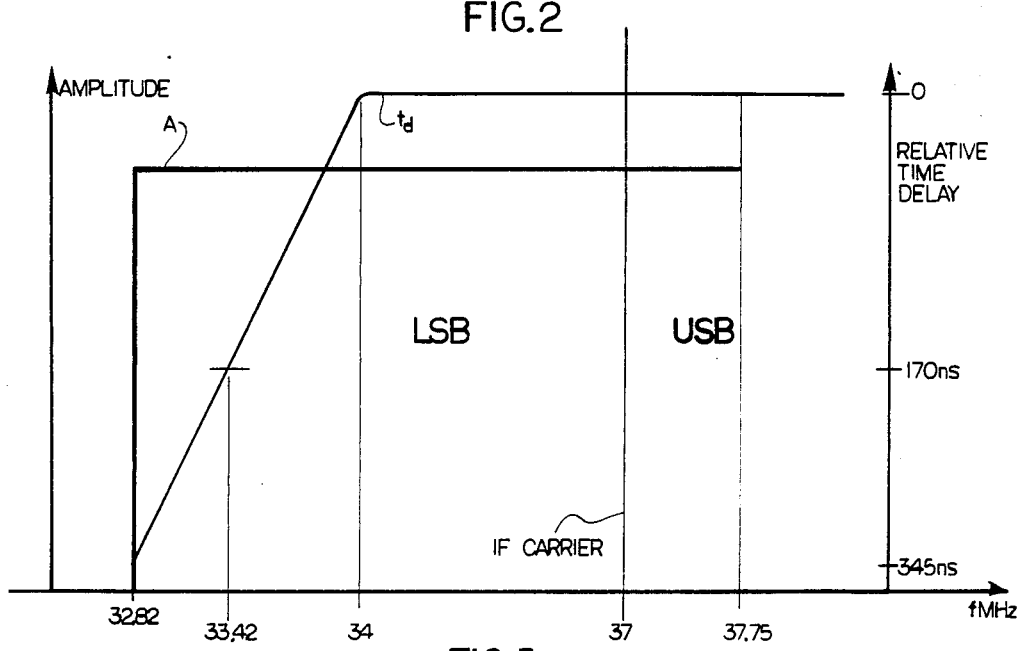
FIG. 5 is a graph illustrating the amplitude and phase versus frequency characteristics of the vestigial sideband filter used in the receiver equalizer of FIG. 4.

The frequency response (amplitude and phase) of the VSB/SAW filter 40 is shown in graph form in FIG. 5. In this Figure the amplitude response of the filter is represented by curve A. The phase response, on the other hand, is presented in FIG. 5 in the form of a curve $t_d$ representing the time delay versus frequency characteristics of the filter. The amplitude and phase response of the fiter is the mirror image (with respect to the carrier frequency) of the amplitude and phase response of the desired signal to be transmitted, as represented by the graphs of FIGS. 1 and 2. As indicated above, the process by which the IF signal is up-converted to the station frequency results in a reflection of the upper and lower sidebands about the carrier frequency. In other words, the locations of the upper and lower sidebands (both phase and amplitude) with respect to the carrier is reversed. Whereas the time delay characteristic of the VSB filter begins to roll off at frequencies more than 3 MHz below the IF carrier frequency, the time delay versus frequency characteristic of the signal transmitted by the station will begin to roll off at a frequency 3 MHz above the picture carrier. The net result is that the SAW filter provides both the VSB filtering and the receiving equalization required of the transmitter.

Figure 6:
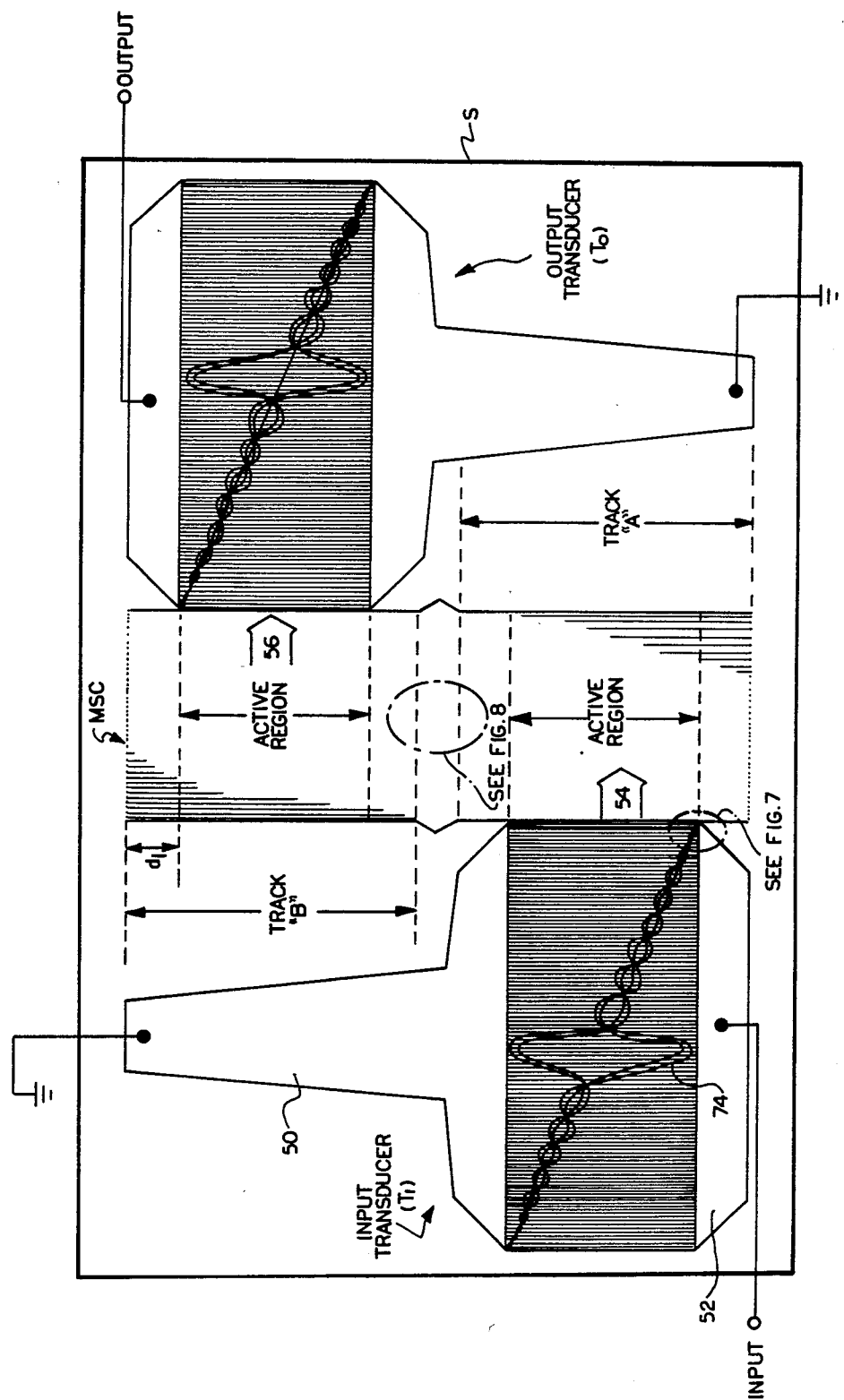
FIG. 6 is a plan view of one embodiment of a SAW filter which could be used as the VSB/SAW filter of FIG. 4.

FIG. 6 is an expanded scale plan view of a preferred embodiment of a surface acoustic wave (SAW) filter for performing the vestigial sideband filtering and receiver equalization functions. The actual device is much smaller, of course, being approximately the size of a postage stamp. The SAW filter includes a substrate material S of lithium niobate or similar material upon which a metallized pattern is formed by conventional techniques. The substrate material is piezoelectric: if an electric potential is applied across two closely spaced electrodes formed on the surface of the device, the substrate will be stressed or deformed at that point. If the electric potential varies, the stress will similarly vary, causing ripples (acoustic waves) to form on the substrate surface much as ripples form on the surface of a body of water when a stone is cast in. Similarly, when a surface acoustic wave passes under a pair of electrodes, a corresponding electric potential forms across the electrodes.

The metallized pattern formed on substrate S includes three components: an input transducer $T_i$, an output transducer $T_o$, and a multi-strip coupler MSC. Generally, the input transducer $T_i$ functions to transform an applied electrical signal into an acoustic wave propagating along track A of the substrate S. The multi-strip coupler MSC extends through track A, and translates the acoustic wave from track A to track B. The output transducer $T_o$ is located in track B and reconverts this acoustic wave back into an electrical signal, where the electrical signal represents the output of the filter. The input and output transducers can be designed so that the relationship between the input and output signal has a desired filter characteristic.

The input signal is supplied across two bus bars 50 and 52 of the input transducer. The two bus bars 50 and 52 have facing boundaries from each of which depends a number of conductive fingers. The fingers depending from the grounded bus bar 50 are parallel both to one another and to the fingers depending from the "hot" bus bar 52. The two sets of fingers are interdigitated in such a fashion that the input signal applied thereacross induces an acoustic wave which propagates in a direction generally perpendicular to the orientation of the fingers. Thus, the input transducer effectively transforms an electrical signal applied across the bus bars 50 and 52 into an acoustic wave propagating in a direction 54 towards and through the multi-strip coupler MSC. The active region of the transducer, wherein this transformation takes place, is generally bounded by the facing boundaries of the two bus bars 50 and 52.

The manner in which the fingers depending from the bus bar 50 interleave with the fingers depending from bus bar 52 cannot be readily portrayed in FIG. 6, in view of the very large number of fingers included in the transducer. There will, for example, often be several hundred of these fingers extending from each of the bus bars of the input transducer. The detailed configuration of the fingers can perhaps be more readily seen in FIG. 7, which is a detailed view of the portion of the input transducer $T_i$ adjacent a corner of the bus bar 52.

Figure 7:
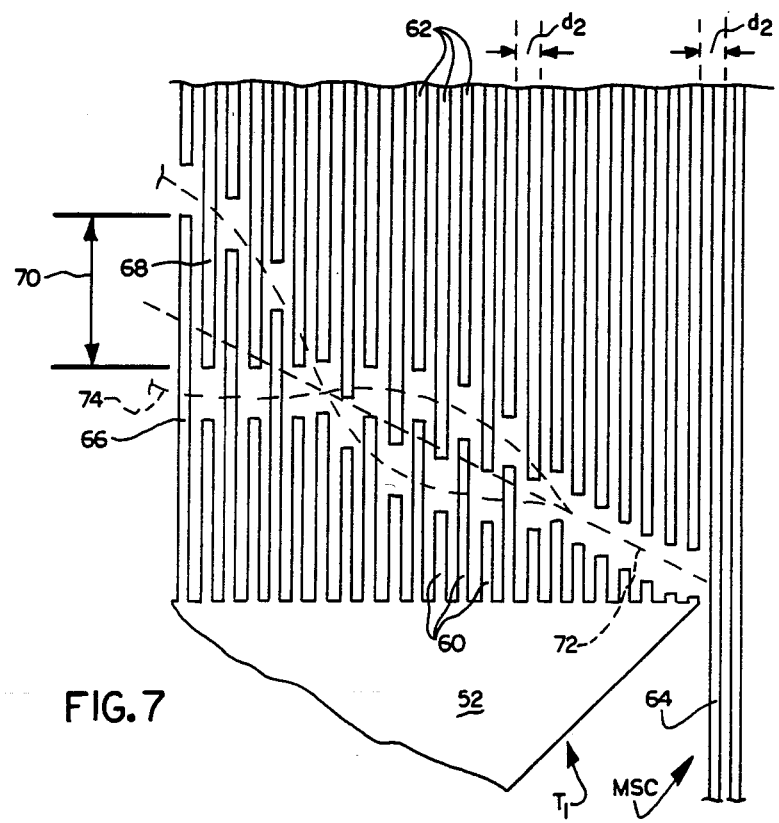
FIG. 7 is a detailed view of a portion of the input transducer of the SAW filter of FIG. 6.

FIG. 7 shows a portion of the hot bus bar 52, plural linear and substantially parallel fingers 60 extending from a boundary of the bus bar 52, similar fingers 62 extending in the opposite direction from the ground bus bar 50, and several of the fingers 64 of the multi-strip coupler. (The multi-strip coupler will be described hereinafter.) The fingers 60 extending from the hot bus bar 52 are each essentially co-linear with a corresponding one of the fingers 62 extending from the grounded bus bar 50. The end of each of the fingers 60 terminates sufficiently distant from the termination of the corresponding one of the fingers 62 that the voltage drop thereacross does not induce a substantial acoustic wave. The pattern formed by the gaps between fingers 60 and 62 is symmetrical with respect to an axis 72 which extends transversely between one corner of the bus bar 52 and the diagonally opposing corner of the bus bar 50. These gaps are offset from the axis 72 over much of the length of the axis, whereby the fingers 60 overlap the fingers 62 to varying extents.

For example, the finger 66 extending from bus bar 52 overlaps the finger 68 extending from bus bar 50 in the region designated in FIG. 7 by reference numeral 70. An AC signal applied across the bus bars induces a corresponding acoustic wave in the region 70. This acoustic wave travels in a direction substantially perpendicular to the overlap, as indicated by the arrow 54 in FIG. 6. The individual acoustic waves generated by the various overlaps across the axis 72 add together to produce the acoustic wave which enters the multi-strip coupler. By controlling the overlap of the fingers along the axis 72, the relationship between the applied electrical signal and the resulting acoustic wave can be controlled.

For a bandpass filter, the pattern formed by the gaps between the fingers 60 and 62, also known as the "apodization" pattern, has a generally sinX/X distribution, reflected across axis 72 so that the resulting pattern (indicated at 74 in FIG. 6) is the same above and below axis 72. This pattern has a pronounced peak near the center of the transducer, and has progressively smaller peaks at points on the axis 72 nearer the ends of the transducers. The overlap pattern ends before reaching the ends of the axis 72, whereby the last several fingers are essentially nonoverlapped. These final few fingers, although not contributing to the acoustic wave response of the transducer, do provide a relatively smooth and reflection-free acoustic transition between the transducer and the multi-strip coupler.

The spacing between the multi-strip coupler and the two transducers is shown in FIGS. 6 and 7 as being equal to the spacing between the individual conductors and the multi-strip coupler, which is in turn equal to the spacing between the fingers in the active region of the input and output transducers. Because of this, there is no change in the acoustic impedance at the boundary between the multi-strip coupler and the transducers, whereby reduced reflections occur at this point. Alternatively, the multi-strip coupler could be spaced apart from the input transducer $T_i$ by a distance which is approximately one-half a wavelength different than the spacing of the output transducer $T_o$ from the multi-strip coupler. It has been found that this produces a cancellation effect which reduces the spurious reflection component otherwise created by passage of the acoustic wave into and out of the multi-strip coupler.

The purpose of the multi-strip coupler is merely to translate the surface acoustic wave from track A to track B, where track B is parallel to track A but transversely offset therefrom. The multi-strip coupler consists of a large number of filamentary conductors, each extending through both track A and track B. The various filamentary conductors are generally straight, although having a bent region between the two tracks, and are substantially parallel to one another except in the bent region.

As the acoustic wave generated by the input transducer $T_i$ passes the various filamentary conductors in track A of the multi-strip coupler, electrical potentials are developed across the individual filaments 64 of the multi-strip coupler. The electric potentials in turn induce a corresponding acoustic wave in track B. The acoustic wave travels in the direction indicated by the arrow 55, and thus enters the active region of the output transducer $T_o$. The output transducer is essentially identical to the input transducer, and thus likewise includes a plurality of fingers depending from the two bus bars thereof. The acoustic wave travelling along the active region of track B induces an electrical potential across the overlapping fingers in this region, where these incremental electrical potentials combine to produce the output signal which is taken from the hot bus bar of the device.

In the FIG. 6 SAW filter, the multi-strip coupler (MSC) has a form which is improved over the MSC's normally used in SAW devices of this kind. The MSC of FIG. 6 is, for example, long enough that its track A and track B portions are each substantially longer than the active regions of the corresponding tranducers. In prior art SAW filters the MSC's extended only between the outside limits of the active regions of the two transducers. Also, the FIG. 6 MSC includes a bent region between the track A and B regions thereof which was not found in prior SAW filters of this kind.

Figure 8:
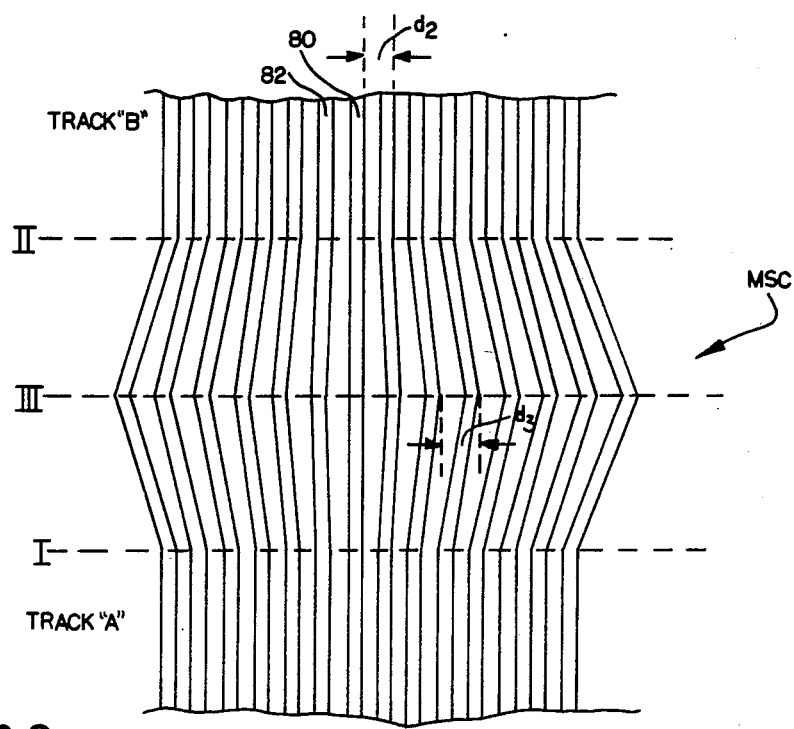
FIG. 8 is a detailed view of the center of the multicoupler of the SAW filter of FIG. 6.

The configuration of the fanned central section of the surface acoustic wave device can perhaps more readily be seen in FIG. 8. FIG. 8 is a much expanded plan view of the central portion of the multi-strip coupler MSC. In FIG. 8, the centrally disposed filamentary conductor is indicated at 80. This filamentary conductor is the only conductor of the multi-strip coupler which follows a continuous linear (unbent) path through the central region between the two tracks of the acoustic surface wave device. The remaining filamentary electrodes follow a somewhat angular path through this central portion, delineated in FIG. 8 by the two boundaries I and II.

The portion of the multi-strip coupler below boundary I corresponds to track A, whereas the portion above boundary II corresponds to track B. In each of these two regions the filamentary conductors which make up the multi-strip coupler are parallel and are spaced apart by equal distances $d_2$. As the filamentary conductors pass through boundary I, however, they diverge slightly from one another so that the distance between the conductors increases. Upon arriving at boundary III, which occurs midway between boundaries I and II, the filamentary conductors are still spaced apart by equal amounts, however this amount is now $d_3$, which is somewhat greater than $d_2$. Preferably, $d_3$ is greater than 1.02 times $d_2$. After passing through boundary III, the filamentary conductors which make up the multi-strip coupler change their direction again, thereafter converging slightly. Upon arriving at boundary II, the spacing between the filamentary conductors of the multi-strip coupler is back to the same $d_2$ spacing as in the portion below boundary I.

As the acoustic wave travels through boundary IF, it induces a voltage in each of the filamentary conductors of the multi-strip conductors. Since these conductors are not parallel, however, the signals induced therein do not add constructively, rather cancelling over the fanned central region of the MSC. This portion of the multi-strip coupler is therefore virtually nonresponsive to the acoustic wave provided in track A by the input transducer $T_i$. Similarly, the portions of the filamentary conductors between boundaries I and II do not radiate acoustic waves. The bent region therefore provides a well defined acoustic boundary between the track A and track B portions of the multi-strip coupler.

Acoustic absorbing material will be used at positions to the left of the input transducer $T_i$, to the right of the output transducer $T_o$, and across the fanned center section of the MSC so as to absorb acoustical waves reaching these points on the substrate and thereby reduce reflected components. For simplicity of illustration, the acoustic absorbing material is not shown in the Figure.

The surface acoustic wave filter shown in FIGS. 6, 7 and 8 can readily be designed to incorporate the receiver equalizer function through use of conventional SAW filter design techniques. One of these techniques is an iterative approach, wherein a computer program is used to model the surface acoustic wave filter, and wherein the extent of overlap of each pair of electrodes is incrementally adjusted until a length is found for which the resulting transfer characteristic of the modeled device most closely matches the desired characteristic. The program then goes on to incrementally adjust the extent of overlap of the next pair of fingers, and so on in an iterative approach. Often, several "passes" through the filter are taken, wherein each pass involves the adjustment of all of the overlaps of the filter. The iterative procedure converges quite rapidly, so that the apodization pattern initially selected is relatively unimportant. Usually, however, a sinX/X pattern is used as the initial apodization pattern, substantially as described hereinabove.

Once an apodization pattern is selected through this computer modeling technique, the apodization pattern may be further adjusted from its computer modeled form in such a fashion to compensate for known differences between the response of the and the response of an actual device. The resulting apodization pattern can then be directly implemented in a SAW filter of the type illustrated in FIGS. 6–8 to thereby produce a SAW filter having the desired VSB amplitude characteristics and receiver equalizer time delay characteristics.

Although the invention has been described with respect to a preferred embodiment, it will be appreciated that various rearrangements and alterations of parts may be made without departing from the spirit and scope of the present invention, as defined in the appended claims.

What is claimed is:

1. A visual exciter for use in a TV broadcasting system comprising means for receiving an unequalized and undelayed video signal to be broadcast, IF modulator means for modulating an intermediate frequency (IF) carrier signal in accordance with said unequalized and undelayed video signal, filtering means for filtering the modulated IF carrier signal provided by said modulator means, said filtering means comprising a SAW filter having an amplitude versus frequency characteristic selected to provide vestigial sideband filtering of said modulated IF carrier signal, and further having a time delay versus frequency characteristic selected to provide receiver equalization of said modulated IF carrier signal, and frequency translating means responsive to the filtered and equalized signal provided by said filtering means for translating the frequency of said signal to a carrier frequency suitable for broadcasting.

2. A visual exciter as set forth in claim 1, wherein the frequency of said IF carrier signal is 37 MHz, said IF modulator means amplitude modulates said 37 MHz IF carrier signal with said video signal, and wherein said SAW filter has a bandpass amplitude versus frequency characteristic with corner frequencies of approximately 32.82 MHz and 37.75 MHz and a substantially flat response between said corner frequencies, and further having a time delay versus frequency characteristic including zero relative delay above 34 MHz and a delay which linearly changes below 34 MHz to −170 ns relative time delay at 33.42 MHz and to −345 ns relative time delay at 33.82 MHz.

3. A visual exciter as set forth in claim 1, wherein said SAW filter comprises a piezoelectric substrate having input and output transducers formed thereon the respectively generating and receiving acoustic waves on the surface of said substrate, said transducers being formed of patterns of electrically conductive material affixed to said substrate, each said transducer including first and second bus bars and plural filamentary fingers, said fingers extending from each of said bus bars toward the other of said bus bars, where the fingers depending from each said bus bar interleave the fingers depending from the other said bar and are of lengths chosen to form a selected apodization pattern, the apodization patterns of said input and output transducer being selected such that said SAW filter has a said amplitude versus frequency characteristic of a vestigial sideband filter and has a said relative time delay versus frequency characteristic selected to compensate for a complementary characteristic of a subsequent TV receiver.

4. A SAW filter for use in providing vestigial sideband filtering of an unequalized and undelayed video signal in a visual exciter, comprising a piezoelectric substrate having input and output transducers formed thereon for respectively generating and receiving acoustic waves on the surface of said substrate, said transducers being formed of patterns of electrically conductive material affixed to said substrate, each said transducer including first and second bus bars and plural filamentary fingers, said fingers extending from each of said bus bars toward the other of said bus bars, where at least some of the fingers depending from each said bus bar interleave at least some of the fingers from the other said bus bar and are of lengths chosen to form a selected apodization pattern, the apodization patterns of said input and output transducer being selected such that said SAW filter has an amplitude versus frequency characteristic of a vestigial sideband filter and a relative time delay versus frequency characteristic selected to compensate for a complementary characteristic of a subsequent TV receiver.

* * * * *